(12) United States Patent
Nelson et al.

(10) Patent No.: US 7,663,890 B2
(45) Date of Patent: Feb. 16, 2010

(54) PRINTED CIRCUIT BOARDS FOR USE IN OPTICAL TRANSCEIVERS

(75) Inventors: Stephen Nelson, Cupertino, CA (US); Donald White, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 387 days.

(21) Appl. No.: 11/298,139

(22) Filed: Dec. 9, 2005

(65) Prior Publication Data

US 2006/0118331 A1 Jun. 8, 2006

Related U.S. Application Data

(63) Continuation of application No. 10/762,860, filed on Jan. 22, 2004, now Pat. No. 7,020,960.

(60) Provisional application No. 60/483,702, filed on Jun. 30, 2003.

(51) Int. Cl.
H05K 7/02 (2006.01)
H05K 7/06 (2006.01)
H05K 7/08 (2006.01)
H05K 7/10 (2006.01)

(52) U.S. Cl. .................. 361/760; 361/767; 361/792
(58) Field of Classification Search ......... 174/259–261; 361/767, 792

See application file for complete search history.

(56) References Cited

U.S. PATENT DOCUMENTS

| 3,128,332 | A |   | 4/1964  | Burkig et al. |
|-----------|---|---|---------|---------------|
| 3,142,112 | A |   | 7/1964  | Burkig et al. |
| 3,718,936 | A |   | 2/1973  | Rice          |
| 4,560,962 | A |   | 12/1985 | Barrow        |
| 4,764,806 | A |   | 8/1988  | Altman        |
| 4,859,806 | A |   | 8/1989  | Smith         |
| 4,890,157 | A | * | 12/1989 | Wilson ................. 257/668 |
| 6,250,820 | B1| * | 6/2001  | Melchior et al. ........... 385/89 |
| 6,479,765 | B2|   | 11/2002 | Ramey et al.  |
| 6,486,549 | B1|   | 11/2002 | Chiang        |
| 6,788,546 | B1| * | 9/2004  | Steiert et al. ............. 361/760 |
| 6,794,741 | B1|   | 9/2004  | Lin et al.    |
| 6,812,803 | B2|   | 11/2004 | Goergen       |

* cited by examiner

*Primary Examiner*—Tuan T Dinh
(74) *Attorney, Agent, or Firm*—Workman Nydegger

(57) ABSTRACT

One example of an optical transceiver includes a housing and an optical transmitter and optical receiver disposed within the housing. A PCB is also disposed in the housing. The PCB has front and side edges, as well as circuitry in communication with the optical transmitter and the optical receiver. The PCB also includes a group of plated contact pads, each of which includes a front-most extremity that terminates short of the front edge. Finally, the PCB includes a group of traces, one of which leads from one of the side edges of the PCB to a via that is connected with the circuitry, and another of which leads from the via to one of the plated contact pads.

19 Claims, 6 Drawing Sheets

PRINTED CIRCUIT BOARDS FOR USE IN OPTICAL TRANSCEIVERS

CROSS-REFERENCE TO RELATED APPLICATIONS

This application is a continuation, and claims the benefit, of U.S. patent application Ser. No. 10/762,860, entitled SYSTEMS AND METHODS FOR FABRICATING PRINTED CIRCUIT BOARDS, filed Jan. 22, 2004 now U.S. Pat. No. 7,020,960, which, in turn, claims the benefit of U.S. Provisional Patent Application No. 60/483,702, entitled SYSTEMS AND METHODS FOR FABRICATING PRINTED CIRCUIT BOARDS, filed Jun. 30, 2003. All of the aforementioned applications are incorporated herein by this reference.

BACKGROUND OF THE INVENTION

1. The Field of the Invention

The present invention generally relates to printed circuit boards (PCBs). More particularly, the present invention relates to systems and methods for fabricating printed circuit boards and more specifically to systems and methods for plating traces on PCBs.

2. Related Technology

An integral component of many electrical and optical devices is a multi-layer printed circuit board (PCB). PCBs are used, for example, to route signals and provide connections to various electrical and/or optical components. During plating, which is one of the steps that occurs during the fabrication of a PCB for example, some or all of the traces, vias, pads, etc., are plated with hard gold. Plating ensures that the PCB can make a solid electrical connection and strengthens the electrical integrity of the PCB. Usually, all features of the PCB requiring plating are plated at the same time.

The typical plating process involves shorting all the contact pads by connecting them to small traces, which extend off the front edge of the PCB. The small traces then connect to a plating bar and a voltage is applied. By connecting all of the traces to a plating bar, all of the signal paths requiring plating in the PCB form a single conductive path. By applying a voltage, the resulting current electronically plates the gold on to the contact pads. In other words, all necessary signal paths are plated with hard gold at the same time. After the plating process is complete, the traces used to plate the appropriate portions of the PCB are cut at the front edge of the PCB, thus eliminating the short between the contact pads. One of the problems with this process is that small traces that extend from the contact pads to the front edge of the PCB remain on the PCB.

This problem is illustrated in FIG. 1 where the traces used to plate the contact pads (and other traces, signals, vias, etc. of the PCB) remain after the PCB has been routed to a final form factor. In FIG. 1, the contact pads 102 provide electrical access to the signal or conductive paths of the PCB 100. As previously described during the plating process, the traces 104 were formed and connected to a plating bar (not shown). Thus, the PCB 100 illustrates the traces 104 that were used to plate the contact pads 102 and other conductive paths of the PCB 100. Note that FIG. 1 illustrates the contact pads of the PCB 100, but it is understood that the other conductive paths that are connected with the contact pads are also plated.

Unfortunately, the traces 104 are in the area 106 between a front edge 103 of the PCB and the contact pads 102. The presence of the small traces 104 in the area 106 of the PCB 100 may violate certain standards. In particular, the traces 104 may violate the GBIC/MSA standard. This standard requires that the contact pads within a GBIC/MSA device be set back from the PCB edge. Other small form factor pluggable standards (GBIC, SFP, XFP) may have similar requirements.

Another problem produced by the typical plating process is that it may interfere with high-speed traces, which are connected to certain contact pads. The purpose of the high-speed traces is to send high-speed data through the PCB. To achieve this purpose, high-speed traces involve careful balancing of impedances. The small traces that extend from the contact pads to the edge of the PCB disrupt this balance and reduce the ability of the high speed traces to effectively transfer data at high speeds. Cutting the small traces produces large stubs at the edge of the PCB, which do not affect performance of low speed traces but create interference among the high-speed traces and adversely affect the performance of these high-speed lines.

Previous attempts to improve the plating process and eliminate the extension of small traces to the front edge of the PCB have been unsatisfactory. For example, etching, a technique employed to remove the small traces 104 from the area 106 of the PCB after the plating process, is expensive for use in low-cost transceiver modules.

BRIEF SUMMARY OF AN EXAMPLE EMBODIMENT OF THE INVENTION

Exemplary embodiments of the present invention relate to printed circuit boards and optical transceivers in which such printed circuit boards may be employed. In one example, an optical transceiver includes a housing and an optical transmitter and optical receiver disposed within the housing. A PCB is also disposed in the housing. The PCB has front and side edges, as well as circuitry in communication with the optical transmitter and the optical receiver. The PCB also includes a group of plated contact pads, each of which includes a front-most extremity that terminates short of the front edge. Finally, the PCB includes a group of traces, one of which leads from one of the side edges of the PCB to a via that is connected with the circuitry, and another of which leads from the via to one of the plated contact pads.

These and other aspects of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXAMPLE EMBODIMENTS

The present invention relates to systems and methods for fabricating printed circuit boards (PCBs) and more particularly to plating conductive paths including contact pads of PCBs. The present invention has the advantage of eliminating the small plated traces that extend to the front edge of a PCB from the contact pads and also of minimizing the stub length on high speed transmission lines on the PCB that are formed during the conventional plating process.

To eliminate the small traces extending to the front edge of the PCB, the contact pads on the external layer are connected to traces on an internal layer(s) of the PCB. The external contact pads are connected to the internal traces through vias, small pathways running between the layers of the PCB. The vias are formed through the multi-layer PCB by a drilling operation performed before the plating process. The traces lead to the sides of the PCB instead of to the front edge of the PCB. During the plating process metal is deposited through the vias onto each layer of the PCB.

As indicated, the traces on the internal layer(s) are routed to the sides of the PCB where are attached to an external plating bar. The external plating bar serves to short all the connections from the traces together at one central point. In this example, the PCB includes a single conductive path. Once the traces are attached to the plating bar, a current or voltage is used to deposit the gold onto the contact pads, conductive paths, vias, traces, and the like.

Plating the high speed traces or transmission lines on a PCB can result in problems as the traces used to plate the high speed traces may form long stubs that interfere with the impedance of the high speed traces. In one embodiment, thin traces connect the high-speed traces to ground pins located on the PCB near the high-speed traces and thus create a short during the plating process between the ground pins and the high-speed traces. After completion of the plating process, a hole is drilled through the thin trace, thus removing the short. The hole leaves a very short stub that will not adversely affect performance of the high-speed trace, unlike the large stubs created when a connecting trace is routed to the side of the PCB.

The present invention is described in terms of a PCB used, for example, in Gigabit Interface Converters ("GBIC") devices such as GBIC optical transceivers. One of skill in the art, however, can appreciate that the present invention relates generally to PCBs and is not limited to PCBs used in specific devices. Embodiments of the present invention thus extend to PCBs that can be implemented, for example, in SFP, XFP devices, and the like.

Figure 1:
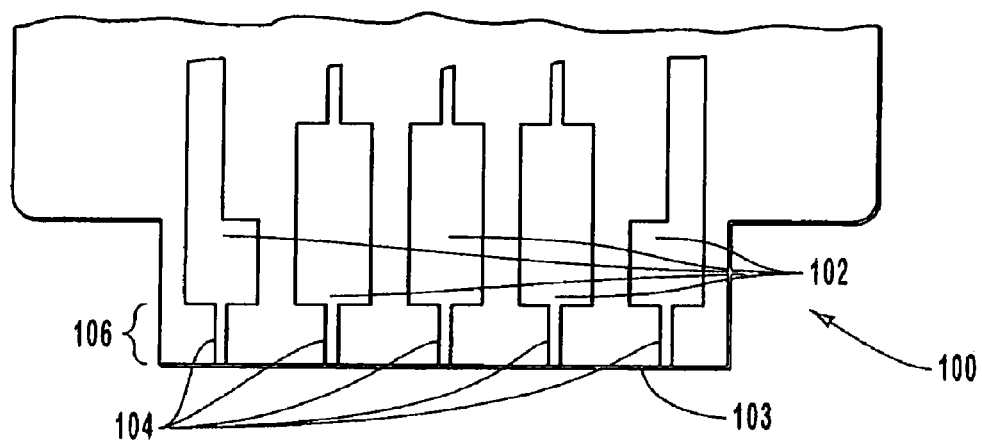
FIG. 1 illustrates a top view of a PCB having traces that extend from a front edge of the PCB to the contact pads of the PCB.
Figure 2:
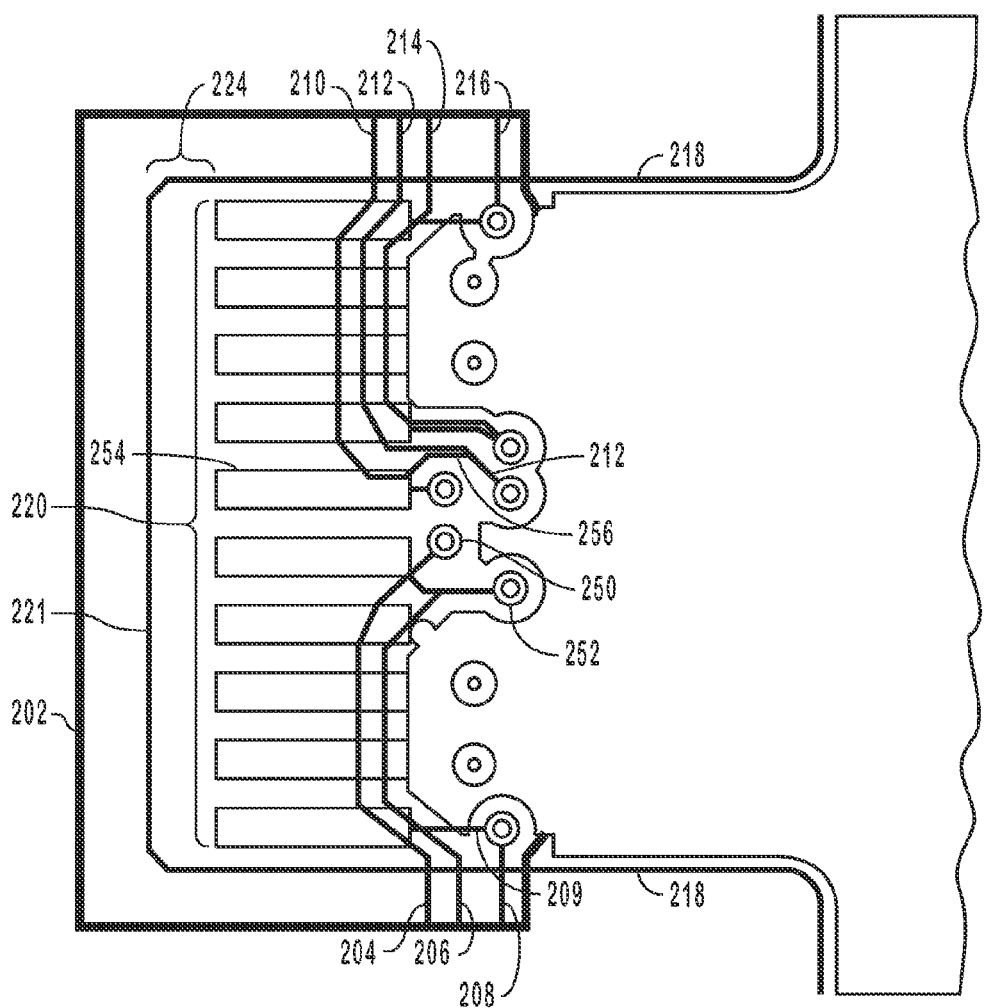
FIG. 2 illustrates a view of the top external layer of a PCB that is plated without leaving traces between the edge of the PCB and the contact pads.

As illustrated in FIG. 1, current plating technologies leave traces 104 that are undesirable in some instances. Specifically, the plated traces 104 may violate the specifications of some standards such as the GBIC/MSA standard. FIG. 2 illustrates a PCB fabricated in accordance with one embodiment of the present invention that eliminates the traces 104 as illustrated in FIG. 1.

FIG. 2 illustrates a PCB 200 that is defined by the outline 218. As illustrated, the area 224 between the contacts 220 and a front edge 221 of the PCB 200 does not include any traces such as the traces 104 illustrated in FIG. 1. The contact pads 220 along with other conductive paths within and/or on the PCB 200 are typically plated with hard gold (or other suitable material). In this example, traces are used to form a single conductive path between the contact pads 220 and other conductive paths and a plating bar 202. The traces, illustrated as traces 210, 212, 214, 216, 204, 206, and 208, lead from a conductive path on the PCB 200 to a side edge of the PCB 200. Usually, the traces are on an internal layer of the PCB 200.

The traces 210, 212, 214, 216, 204, 206, and 208 do not lead to the front edge 221 of the PCB 200. For example, the trace 206 leads from a side edge of the PCB 200 to a via 252. This portion of the trace 206 is likely on an internal layer of the PCB 200. A trace from the via 252 to one of the contact pads 220 completes the trace. This portion of the trace 206 from the via 252 to the contact, however, may be on an external layer or on another internal layer of the PCB 200. Other contact pads 220 have a trace that can be followed to a side edge of the PCB 200. As previously stated, the portion of the trace from the contact pad to a via may be on an external layer of the PCB 200 while the remaining portion of the trace from the via to the side edge of the PCB is on an internal layer of the PCB. The vias are used to provide a connection from the external layer of the PCB to the internal layers of the PCB. In one embodiment, the traces 210, 212, 214, 216, 204, 206, and 208 can exist on different layers of the PCB 200. This often occurs in order to insure that the various conductive paths are electrically isolated when the PCB 200 is routed to the outline 218.

The traces 210, 212, 214, 216, 204, 206, and 208, when connected with the plating bar 202, cause the contact pads, vias, signal paths, etc. on the PCB 200 to form a single conductive path in one embodiment. A current or voltage can then be used to plate all of the conductive paths at the same time. After the conductive paths such as the contact pads are plated, the PCB is cut or routed to a final outline (indicated by the outline 218). By cutting the PCB 200 to the outline 218 the connections between the traces 210, 212, 214, 216, 204, 206, and 208 is removed and the various conductive paths of the PCB 200 are electrically isolated.

Figure 3:
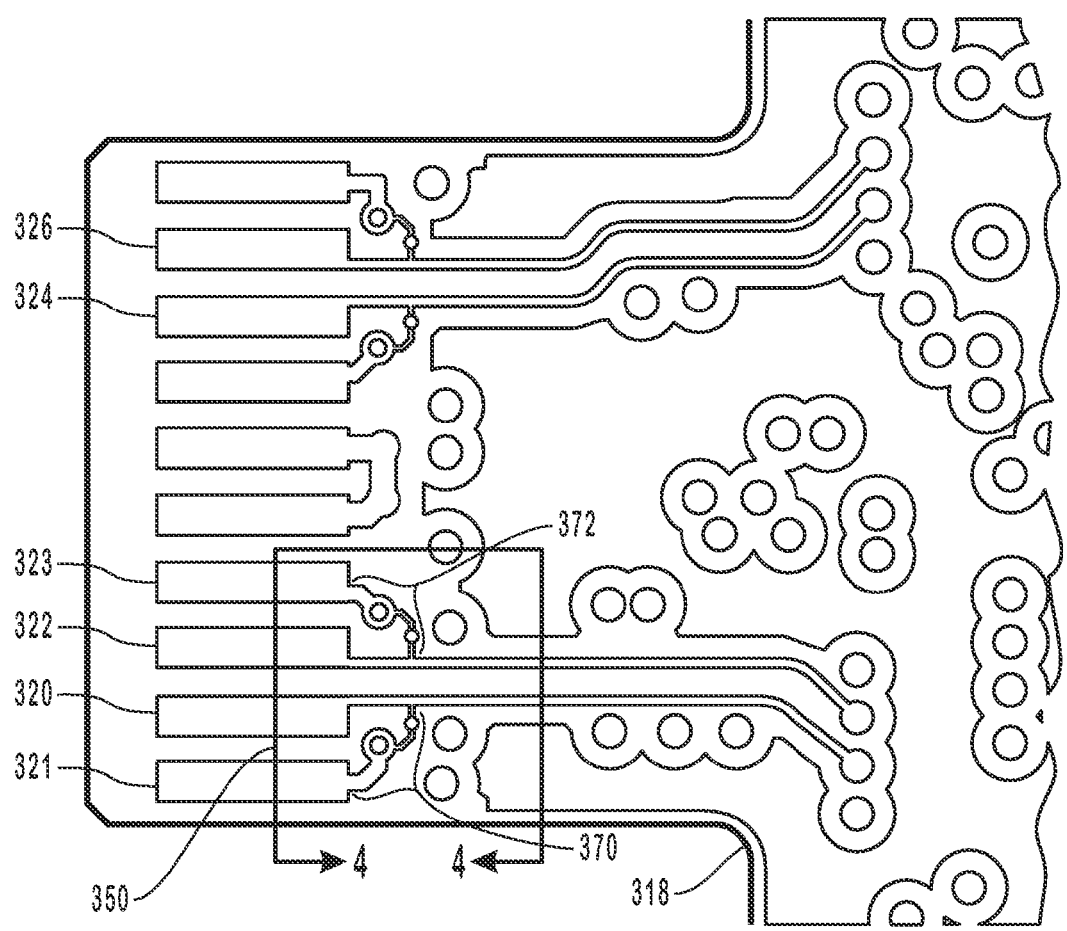
FIG. 3 illustrates a top view of a PCB where a high speed transmission line is plated.

FIG. 3 illustrates another embodiment of the present invention that also relates to plating transmission lines or high speed traces. The PCB 300 in this example, includes transmission lines 320, 322, 324, and 326. Because transmission lines may be sensitive to impedances, it is undesirable to have long stubs. For example, if a trace is formed from the transmission line 322 over to a side edge of the PCB 300, then the trace would form a long stub and would remain attached to the transmission line 322 after the PCB was routed to a final form factor. This trace would be similar to the traces 210, 212, 214, 216, 204, 206, and 208 illustrated in FIG. 2.

Figure 4:
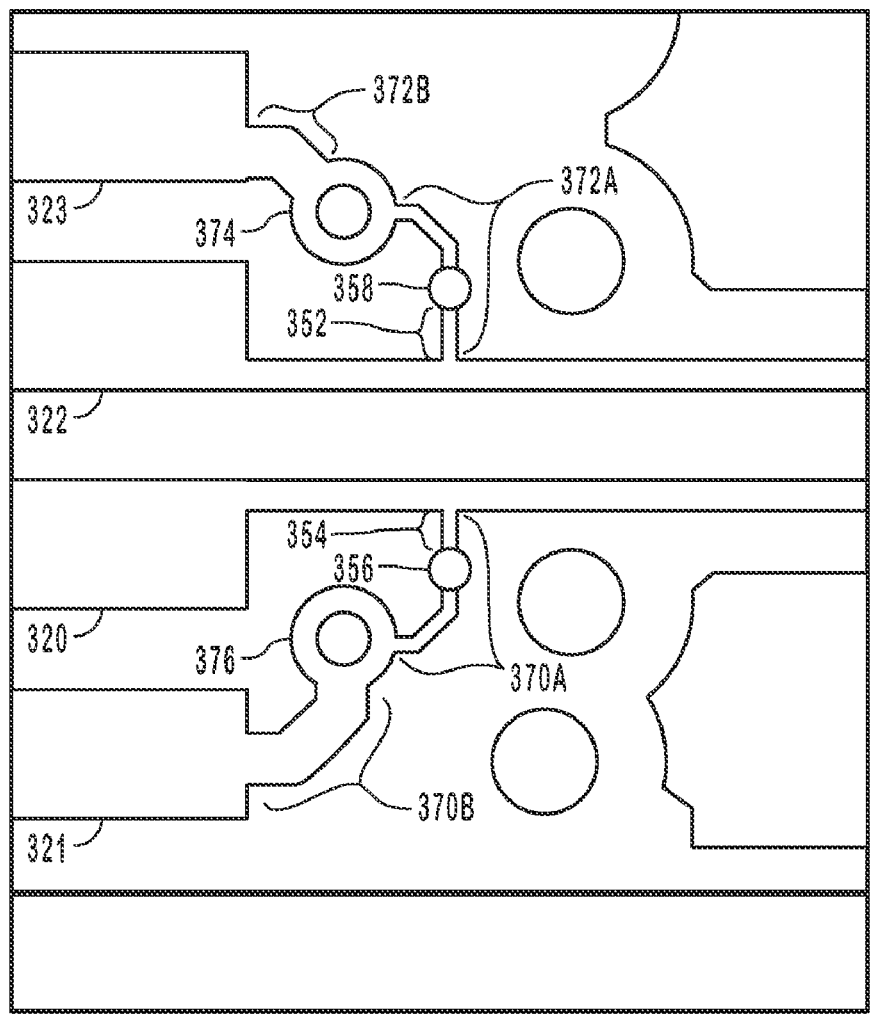
FIG. 4 is a magnified view of a portion of the PCB in FIG. 3 and illustrates plated transmission lines.

As illustrated in FIG. 3, a trace 370 is formed from a transmission line 320 to a nearby contact 321 that is not affected by longer stubs. In one embodiment, the trace 370 may connect to another signal such as a ground plane and the like. This is more clearly illustrated in FIG. 4, which is an expanded view of a particular portion 350 of FIG. 3. The process for plating the high speed transmission lines 320 and 322 begins by forming a trace to a nearby conductive path or signal. In this example, the transmission line 320 is connected with the contact 321 using a trace 370 and the transmission line 322 connects with a contact 323 using a trace 372, as shown in FIG. 3. As illustrated and described in FIG. 2, the particular contacts 323 and 321 may be connected to a plating bar using another trace.

In this example, the trace 370A of trace 370 is formed from the transmission line 320 to a via 376 either on a top layer of the PCB or on an internal layer of the PCB. The trace 370B connects to the trace 370A through the via 376 and the trace 370B connects to the contact 321. In a similar fashion, the trace 372A of trace 372 is formed from the transmission line 322 to a via 374 either on a top layer of the PCB or on an internal layer of the PCB. The trace 372B connects to the trace 372A through the via 374 and the trace 372B connects to the contact 323. For this example, the traces illustrated in FIG. 2 are not shown for clarity although they are present in order to plate all conductive paths of the PCB as previously described. Using the traces 372 and 370, the high speed transmission lines are plated during the plating process.

After the plating process has been completed and the transmission lines are plated, a drilling process creates small holes 356 and 358 in the traces 370A and 372A respectively to disconnect the traces 370 and 372, respectively, from the high speed transmission lines. After the drilling process is completed, short stubs 352 and 354 remain, but these short stubs do not adversely affect the integrity of the high-speed traces to which they are attached. By controlling the drilling process, the length of the short stubs 352 and 354 can be negligible.

In contrast, plating the transmission lines using a trace as described with reference to FIG. 2 leaves a long stub from the transmission line to the edge of the PCB. This long stub may have an adverse effect on the transmission line.

In another embodiment, the transmission lines may be plated using traces as described with FIG. 2 in combination with a drilling process that results in a short stub as described. In each embodiment, a short stub is left. The length of the stub, however can be controlled by drilling holes that are close to the transmission lines.

Figure 5:
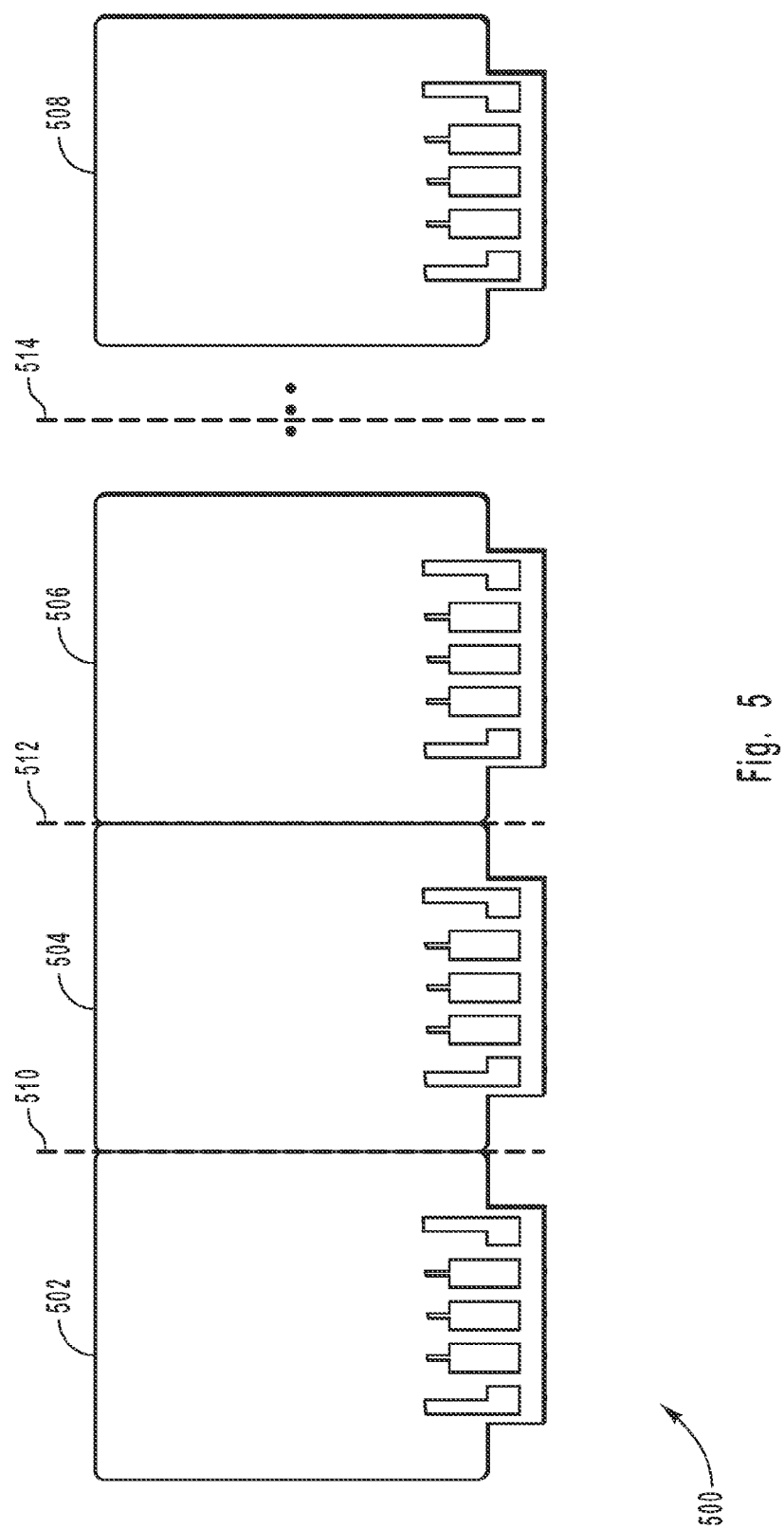
FIG. 5 illustrates a board that includes multiple PCBs that are all plated at the same time.

In another embodiment, more that one PCB can be plated at the same time. FIG. 5, for example, illustrates a plurality of PCB boards 500 that are all connected during the fabrication of the PCBs including the plating process. At a later stage of PCB fabrication, the PCB boards 500 are cut into separate PCB boards 502, 504, 506, and 508 by separating the individual PCB boards along the dashed lines 510, 512, and 514. A drilling process then forms holes such that the high speed transmission lines are not connected to long stubs that may adversely affect the transmission ability of the transmission lines. The drilling process may occur before the individual PCB are routed.

Figure 6:
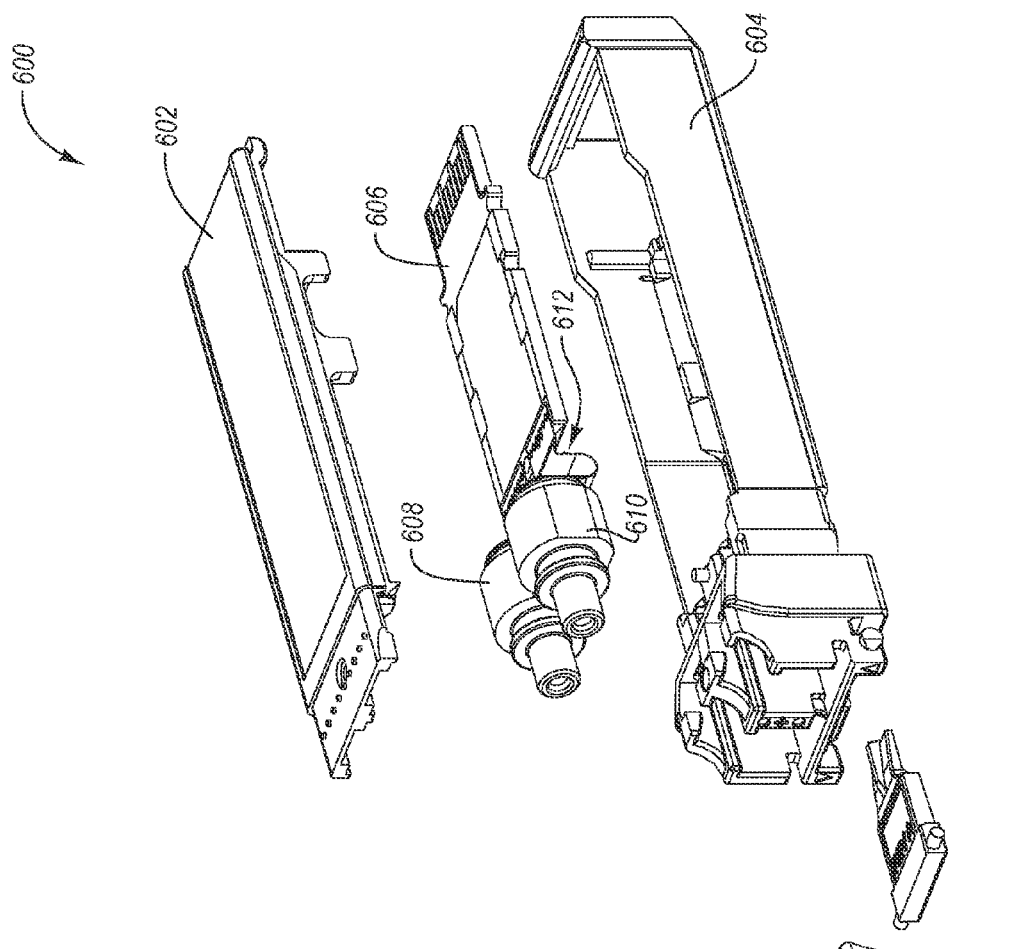
FIG. 6 discloses aspects of an example transceiver in connection with which embodiments of the PCBs may be employed.

As indicated in FIG. 6, example embodiments of the disclosed PCBs may be employed in transceiver modules. Particularly, an optical transceiver module 600 is disclosed that includes upper housing portion 602 and lower housing portion 604 that cooperate to define a housing within which a PCB 606, such as those disclosed herein, is disposed An optical transmitter assembly 608, and an optical receiver subassembly 610 are disposed within the housing. The optical transmitter assembly 608, and an optical receiver subassembly 610 can communicate with the PCB 606 by way of respective connectors 612.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transceiver, comprising:
    a housing;
    an optical transmitter located within the housing;
    an optical receiver located within the housing; and
    a PCB located within the housing, the PCB comprising:
        front and side edges;
        circuitry in communication with one of the optical transmitter and the optical receiver;
        a plurality of plated contact pads, each of which includes a front-most extremity that terminates short of the front edge; and
        a plurality of traces, one of which leads from one of the side edges of the PCB to a via that is connected with the circuitry, and another of which leads from the via to one of the plated contact pads.

2. The optical transceiver as defined in claim 1, wherein the trace between the via and one of the plated contact pads is formed substantially on an external layer of the PCB.

3. The optical transceiver as defined in claim 1, wherein the trace between the via and one of the plated contact pads is formed substantially on an internal layer of the PCB.

4. The optical transceiver as defined in claim 1, wherein the trace between the via and one of the side edges of the PCB is formed on an internal layer of the PCB.

5. The optical transceiver as defined in claim 1, wherein at least some of the traces reside on different respective layers of the PCB.

6. The optical transceiver as defined in claim 1, wherein the via connects an external layer of the PCB with an internal layer of the PCB.

7. The optical transceiver as defined in claim 1, wherein at least one trace runs between a plated contact pad and an edge of the PCB.

8. The optical transceiver as defined in claim 1, wherein one of the plurality of plated contact pads comprises a portion of a conductive path.

9. The optical transceiver as defined in claim 1, wherein the plurality of contact pads are gold plated.

10. The optical transceiver as defined in claim 1, wherein the plurality of traces and plated contact pads are substantially compliant with the Gigabit Interface Converter (GBIC) Multi-Source Agreement (MSA).

11. The optical transceiver as defined in claim 1, wherein the transceiver is substantially compliant with one of the Small Form Factor Pluggable (SFP) Multi-Source Agreement (MSA); and, the 10 Gigabit Small Form Factor Pluggable (XFP Multi-Source Agreement (MSA).

12. The optical transceiver as defined in claim 8, wherein the conductive path comprises a high speed transmission line.

13. The optical transceiver as defined in claim 8, wherein one of the traces runs from the conductive path to a side edge of the PCB.

14. An optical transceiver, comprising:
    a housing;
    an optical transmitter located within the housing;
    an optical receiver located within the housing; and
    a PCB located within the housing, the PCB comprising:
    front and side edges;
    circuitry in communication with one of the optical transmitter and the optical Receiver;
    a plurality of plated contacts, each of which includes a front-most extremity that terminates short of the front edge;
    a plurality of plated transmission lines, each of which includes a front-most extremity that terminates short of the front edge; and
    a plurality of traces, where a first trace connects one of the contacts with a via that is in communication with the circuitry, and where a second trace has a first end connected to the via and a second end connected with a transmission line, the first and second ends of the second trace being electrically isolated from each other.

15. The optical transceiver as recited in claim 14, wherein the first and second ends of the second trace are electrically isolated from each other by way of an opening that is defined between the first and second ends.

16. The optical transceiver as recited in claim 14, wherein the second trace is formed on an internal layer of the PCB.

17. The optical transceiver as recited in claim 14, wherein the second trace is formed on an external layer of the PCB.

18. The optical transceiver as defined in claim 14, wherein the transceiver is substantially compliant with one of: the Small Form Factor Pluggable (SFP) Multi-Source Agreement (MSA); and, the 10 Gigabit Small Form Factor Pluggable (XFP Multi-Source Agreement (MSA).

19. The optical transceiver as recited in claim 14, wherein the first trace is substantially wider than the second trace.

* * * * *